(12) United States Patent
Kim

(10) Patent No.: US 8,248,877 B2
(45) Date of Patent: Aug. 21, 2012

(54) CIRCUIT FOR COMPENSATING TEMPERATURE DETECTION RANGE OF SEMICONDUCTOR MEMORY APPARATUS

(75) Inventor: Je Yoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 254 days.

(21) Appl. No.: 12/649,016

(22) Filed: Dec. 29, 2009

(65) Prior Publication Data

US 2011/0026349 A1    Feb. 3, 2011

(30) Foreign Application Priority Data

Jul. 31, 2009   (KR) .................. 10-2009-0070780

(51) Int. Cl.
  *G11C 7/04*    (2006.01)
(52) U.S. Cl. ......................................... 365/212
(58) Field of Classification Search .............. 365/212
  See application file for complete search history.

(56) References Cited

U.S. PATENT DOCUMENTS

| | | | |
|---|---|---|---|
| 6,958,613 B2 | 10/2005 | Braun et al. | |
| 6,980,020 B2 | 12/2005 | Best et al. | |
| 7,151,390 B2 | 12/2006 | Nguyen et al. | |
| 7,170,313 B2 | 1/2007 | Shin | |
| 7,176,711 B2* | 2/2007 | Park et al. | 326/30 |
| 7,726,877 B1* | 6/2010 | Avitan | 374/170 |
| 2010/0194794 A1* | 8/2010 | Nose et al. | 345/691 |

FOREIGN PATENT DOCUMENTS

| | | |
|---|---|---|
| JP | 2005-285125 A | 10/2005 |
| JP | 2006-129423 A | 5/2006 |
| KR | 1020070069762 A | 7/2007 |

* cited by examiner

*Primary Examiner* — Huan Hoang
*Assistant Examiner* — Pablo Huerta
(74) *Attorney, Agent, or Firm* — Ladas & Parry LLP

(57) ABSTRACT

A circuit for compensating a temperature measurement range of a semiconductor memory apparatus is presented. The circuit includes an oscillator, a temperature variable pulse generating unit, a counter, and an output controlling unit. The counter enable signal generating unit inputs a temperature pulse and outputs a counter enable signal corresponding to the temperature pulse in response to receiving a control signal. The counter inputs and counts an oscillator signal in response to receiving the counter enable signal and outputs a counting signal. The output controlling unit outputs a temperature information code signal proportional to the counting signal or to output the temperature information code signal at a fixed level corresponding to a maximum value of the counting signal.

14 Claims, 5 Drawing Sheets

300

CIRCUIT FOR COMPENSATING TEMPERATURE DETECTION RANGE OF SEMICONDUCTOR MEMORY APPARATUS

CROSS-REFERENCES TO RELATED PATENT APPLICATION

The present application claims priority under 35 U.S.C 119(a) to Korean Application No. 10-2009-0070780, filed on Jul. 31, 2009, in the Korean Intellectual Property Office, which is incorporated herein by reference in its entirety as set forth in full.

BACKGROUND

1. Technical Field

The embodiment described herein relates to a semiconductor memory apparatus and, more particularly, to a circuit for compensating temperature detection range of a semiconductor memory apparatus.

2. Related Art

In general, a temperature measurement circuit of a semiconductor memory apparatus measures temperature by using an oscillator signal with a frequency that does not vary regardless of variation in temperature and a pulse having a pulse width that varies depending on the variation in temperature. At this time, by using the pulse having the pulse width that varies depending on the variation in temperature as an enable signal of a counter and counting the oscillator signal while the counter is enabled, temperature information is encoded and outputted.

As such, the temperature measurement circuit in which the counter is enabled by using the pulse as the enable signal and the enabled counter counts the oscillator signal has the following problems.

The counter counts the oscillator signal while the pulse is enabled, such that an output of the counter may be larger than the maximum value while the pulse is enabled. If a 4-bit counter has the maximum value (1,1,1,1), a subsequently counted output of the counter is (0,0,0,0).

As a result, the temperature measurement circuit in which an output value of the counter increases as the temperature increases cannot accurately measure the temperature because the counter reaches the maximum value and thereafter, decreases to the minimum value.

SUMMARY

A circuit for compensating a temperature measurement range of a semiconductor memory apparatus that can compensate an output of a temperature measurement circuit of the semiconductor memory apparatus encoding temperature information by means of a counter is disclosed herein.

In one embodiment of the present invention, in a circuit for compensating a temperature measurement range of a semiconductor memory apparatus that outputs a result of counting an oscillator signal as a temperature information code signal when a temperature pulse having a pulse width varying depending on variation in temperature is enabled, it is determined whether or not a counting operation of counting the oscillator signal is performed in response to the temperature pulse and the temperature information code signal and whether or not the temperature information code signal is fixed to a predetermined value.

In another embodiment of the present invention, a circuit for compensating a temperature measurement range of a semiconductor memory apparatus includes a counter enable signal generating unit configured to output a temperature pulse having a pulse width varying depending on variation in temperature as a counter enable signal in response to a control signal; a counter configured to count an oscillator signal in response to the counter enable signal and output a counting result as a counting signal; and an output controlling unit configured to generate the control signal in response to the counting signal and the temperature pulse and output the counting signal as a temperature information code signal or fix the temperature information code signal to the maximum value in response to the control signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
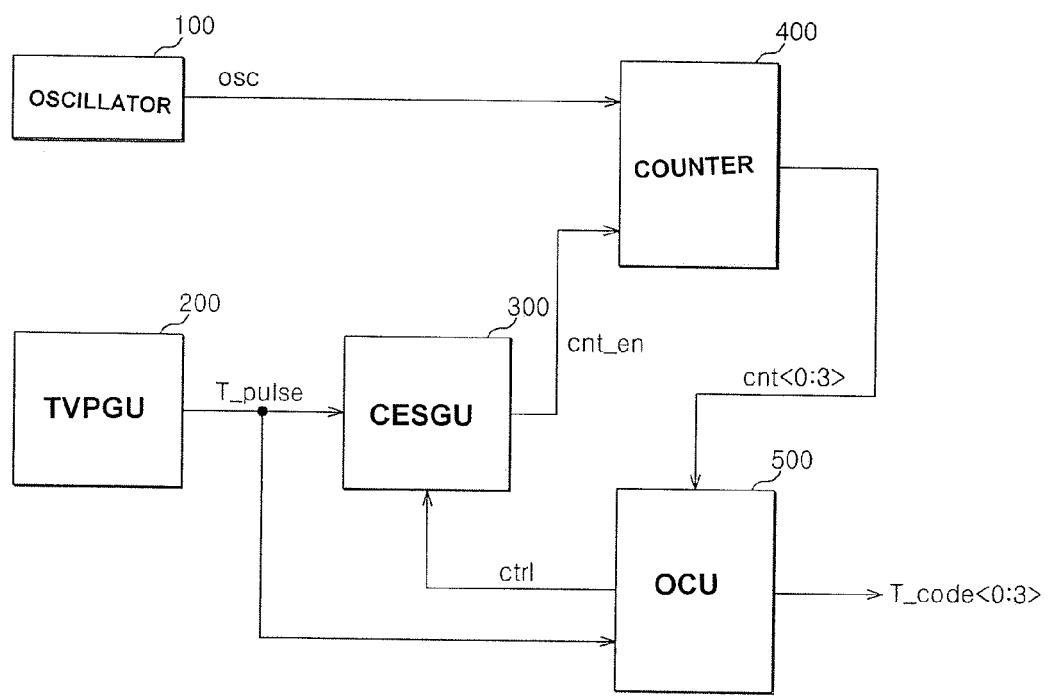
FIG. 1 is a schematic block diagram of an exemplary circuit for compensating a temperature measurement range of a semiconductor memory apparatus according to one embodiment.

A circuit for compensating a temperature measurement range of a semiconductor memory apparatus according to one embodiment, as shown in FIG. 1, can be configured to include a counter enable signal generating unit 300, a counter 400, and an output controlling unit 500 and further include an oscillator 100 and a temperature variable pulse generating unit 200.

The oscillator 100 is preferred to be able to generate an oscillator signal 'OSC' having a predetermined frequency substantially independent of temperature variations.

The temperature variable pulse generating unit 200 (TVPGU) is configured to generate a temperature pulse 'T_pulse' having a pulse width dependent on temperature variation. For example, the temperature variable pulse generating unit 200 can generate the temperature pulse 'T_pulse' having a pulse width that increases as the temperature increases.

The counter enable signal generating unit 300 (CESGU) is configured to be able to output the temperature pulse 'T_pulse' as a counter enable signal 'cnt_en' in response to a control signal 'ctrl'. For example, the counter enable signal generating unit 300 can output the temperature pulse 'T_pulse' as the counter enable signal 'cnt_en' when the control signal 'ctrl' is enabled and disable the counter enable signal 'cnt_en' when the control signal 'ctrl' is disabled.

The counter 400 is configured to count the oscillator signal 'osc' in response to the counter enable signal 'cnt_en' and to output the counting result as a counting signal 'cnt<0:3>'. For example, the counter 400 can increase a value of the counting signal 'cnt<0:3>' by counting the oscillator signal 'osc' when the counter enable signal 'cnt_en' is enabled. Meanwhile when the counter enable signal 'cnt_en' is disabled then the counter 400 stops counting the oscillator signal 'osc' and is reset.

The output controlling unit 500 (OCU) is configured to generate the control signal 'ctrl' in response to the counting signal 'cnt<0:3>' and the temperature pulse 'T_pulse'. The output controlling unit 500 can output the counting signal as a temperature information code signal 'T_code<0:3>' or fix the temperature information code signal 'T_code<0:3>' to the maximum value in response to the control signal 'ctrl'. For example, the output controlling unit 500 can disable the control signal 'ctrl' when the counting signal 'cnt<0:3>' reaches the maximum value and can enable the control signal 'ctrl' when the temperature pulse 'T_pulse' is enabled. Further, the output controlling unit 500 can output the counting signal 'cnt<0:3>' as the temperature information code signal 'T_code<0:3>' when the control signal 'ctrl' is enabled and can fix the temperature information code signal 'T_code<0:3>' to the maximum value (1,1,1,1) when the control signal 'ctrl' is disabled.

The counter enable signal generating unit 300 is configured to output the temperature pulse 'T_pulse' as the counter enable signal 'cnt_en' when the control signal 'ctrl' is enabled to a high level and disable the counter enable signal 'cnt_en' to a low level when the control signal 'ctrl' is disabled to the low level.

Figure 2:
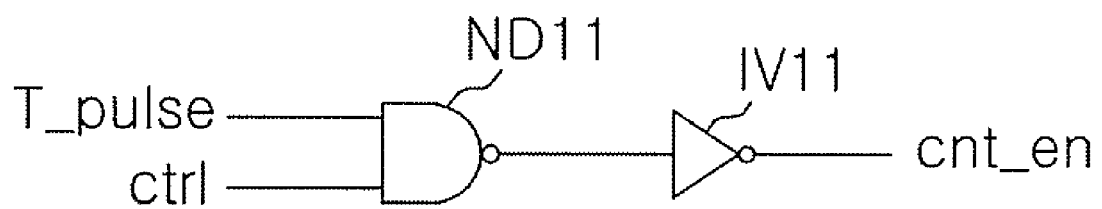
FIG. 2 is a configuration diagram of an exemplary counter enable signal generating unit of FIG. 1 according to one embodiment.

As shown in FIG. 2, the counter enable signal generating unit 300 can be configured to include a first NAND gate ND11 and a first inverter IV11. The first NAND gate ND11 can receive the temperature pulse 'T_pulse' and the control signal 'ctrl'. The first inverter IV1 receives an output signal of the first NAND gate ND11 and outputs the inverted output signal from the first NAND gate ND11 as the counter enable signal 'cnt_en'.

Figure 3:
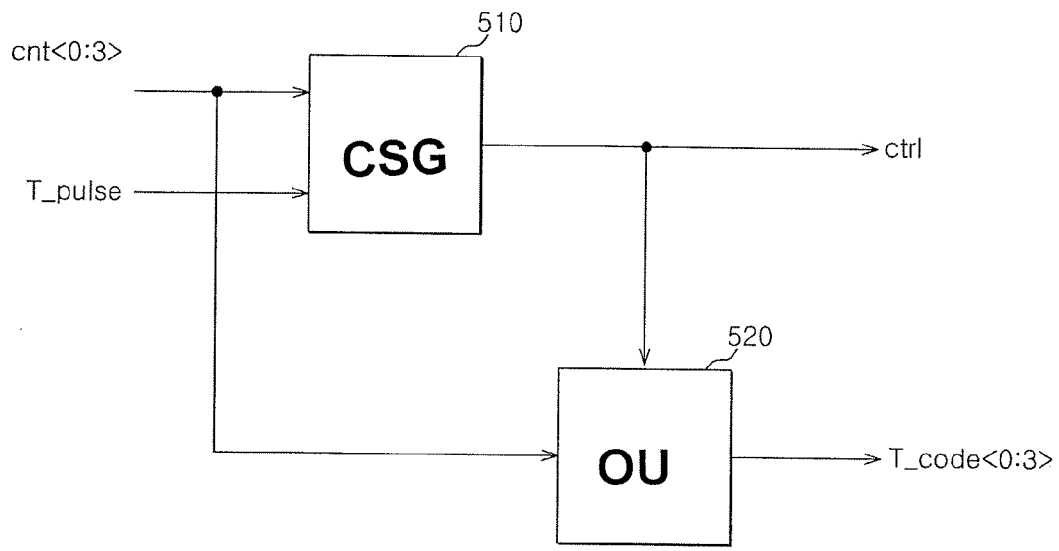
FIG. 3 is a schematic block diagram of an exemplary output controlling unit of FIG. 1 according to one embodiment.

As shown in FIG. 3, the output controlling unit 500 can be configured to include a control signal generator 510 (CSG) and an output unit 520 (OU).

The control signal generator 510 is configured to disable the control signal 'ctrl' to the low level when the counting signal 'cnt<0:3>' reaches the maximum value (1,1,1,1) and to enable the control signal 'ctrl' to the high level when the temperature pulse 'T_pulse' is enabled to the high level.

The output unit 520 is configured to output the counting signal 'cnt<0:3>' as the temperature information code signal 'T_code<0:3>' when the control signal 'ctrl' is enabled to the high level and to fix the temperature information code signal 'T_code<0:3>' to the maximum value (1,1,1,1) when the control signal 'ctrl' is disabled to the low level.

Figure 4:
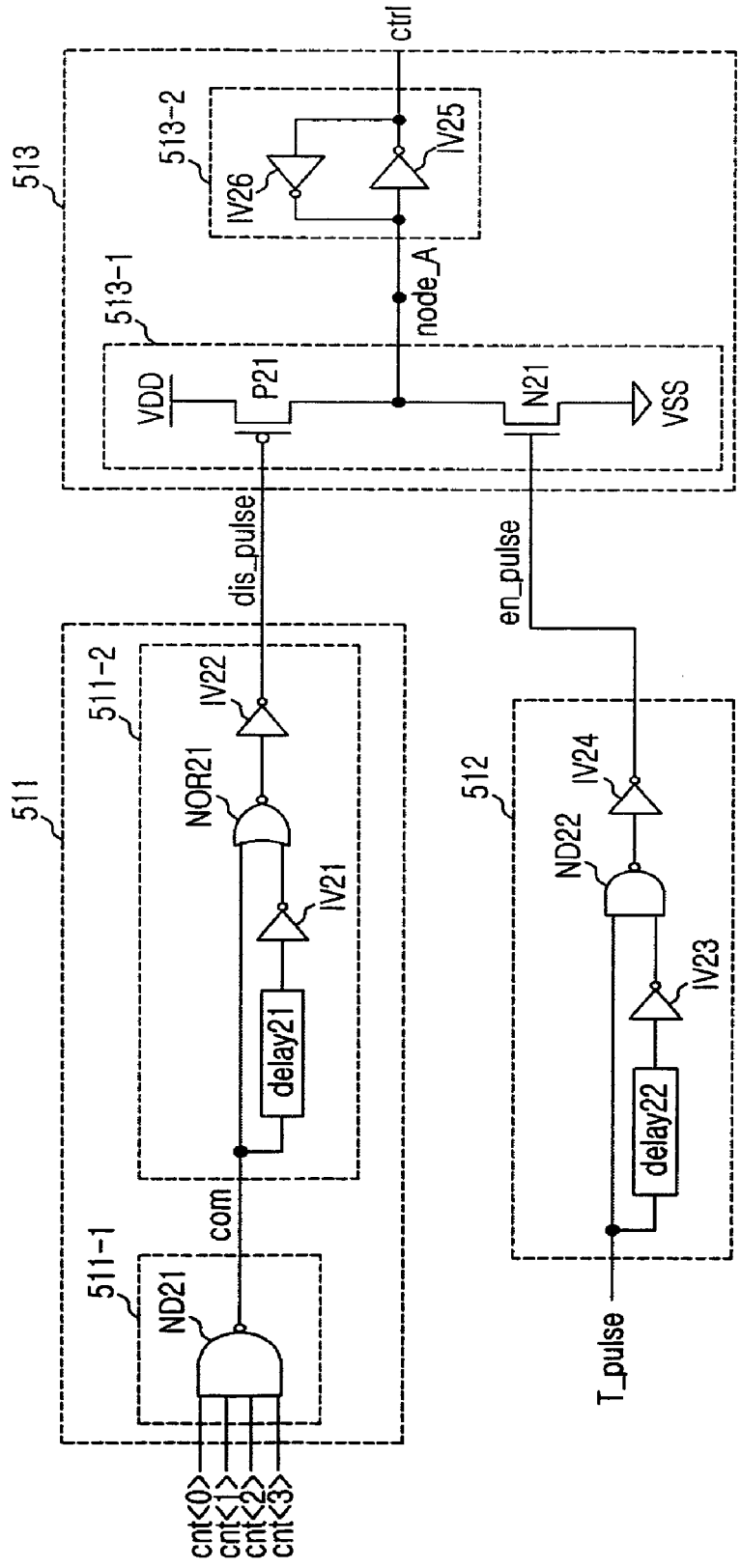
FIG. 4 is a configuration diagram of an exemplary control signal generator of FIG. 3 according to one embodiment.

As shown in FIG. 4, the control signal generator 510 can be configured to include a disable pulse generating unit 511, an enable pulse generating unit 512, and a pulse combining unit 513.

The disable pulse generating unit 511 can be configured to include a comparison portion 511-1 and a first pulse generating portion 511-2.

The comparison portion 511-1 can be configured to generate a comparison signal 'com' enabled to the low level when the counting signal 'cnt<0:3>' reaches the maximum value (1,1,1,1).

The comparison portion 511-1 can be configured to include a second NAND gate ND21. The second NAND gate ND21 can output the comparison signal 'com' by receiving the counting signal 'cnt<0:3>'.

The first pulse generating portion 511-2 can be configured to generate a disable pulse 'dis_pulse' enabled to the low level when the comparison signal 'com' is enabled to the low level.

The first pulse generating portion 511-2 can be configured to include a first delayer delay21, second and third inverters IV21 and IV22, and a NOR gate NOR21. The first delayer delay 21 is configured to receive the comparison signal 'com'. The second inverter IV21 is configured to receive an output signal of the first delayer delay21. The NOR gate NOR21 is configured to receive the comparison signal 'com' and an output signal of the second inverter IV21. The third inverter IV22 is configured to output the disable pulse 'dis_pulse' by receiving an output signal of the NOR gate NOR21.

The enable pulse generating unit 512 can be configured to generate an enable pulse 'en_pulse' enabled to the high level when the temperature pulse 'T_pulse' is enabled to the high level.

The enable pulse generating unit 512 can be configured to include a second delayer delay22, fourth and fifth inverters IV23 and IV24, and a third NAND gate ND22. The second delayer delay22 is configured to receive the temperature pulse 'T_pulse'. The fourth inverter IV23 is configured to receive an output signal of the second delayer delay22. The third NAND gate ND22 is configured to receive the temperature pulse 'T_pulse' and an output signal of the fourth inverter IV23. The fifth inverter IV24 is configured to output the enable pulse 'en_pulse' by receiving an output signal of the third NAND gate ND22.

The pulse combining unit 513 is configured to disable the control signal 'ctrl' to the low level when the disable pulse 'dis_pulse' is inputted and configured to enable the control signal 'ctrl' to the high level when the enable pulse 'en_pulse' is inputted.

The pulse combining unit 513 can be configured to include an output node voltage controlling portion 513-1 and a latch portion 513-2.

The output node voltage controlling portion 513-1 can apply external voltage 'VDD' to an output node 'node_A' during an enable section of the disable pulse 'dis_pulse', that is, a low level section, and the output node voltage controlling portion 513-1 can apply the voltage of ground voltage 'VSS' to the output node 'node_A' during the enable section of the enable pulse 'en_pulse', that is, a high level section.

The output node voltage controlling portion 513-1 can be configured to include first and second transistors P21 and N21. The disable pulse 'dis_pulse' is inputted into a gate of the first transistor P21, the external voltage 'VDD' is applied to a source thereof, and the output node 'node_A' is connected to the drain thereof. The enable pulse 'en_pulse' is inputted into a gate of the second transistor N21, the output node 'node_A' is connected to a drain thereof, and the ground voltage 'VSS' is applied to a source thereof.

The latch portion 513-2 can latch a voltage level of the output node 'node_A' and output the latched voltage level as a voltage level of the control signal 'ctrl'.

The latch portion 513-2 can be configured to include sixth and seventh inverters IV25 and IV26. The output node 'node_A' is connected to an input terminal of the sixth inverter IV25 and the control signal 'ctrl' is outputted from an output terminal of the sixth inverter IV25. The seventh inverter IV26 is configured to receive an output signal of the sixth inverter IV25 and to output the output signal thereof as an input signal of the sixth inverter IV25.

The output unit 520 is configured to output the counting signal 'cnt<0:3>' as the temperature information code signal 'T_code<0:3>' when the control signal 'ctrl' is enabled to the high level. The output unit 520 is configured to fix the temperature information code signal 'T_code<0:3>' to the maximum value (1,1,1,1) when the control signal 'ctrl' is disabled to the low level.

Figure 5:
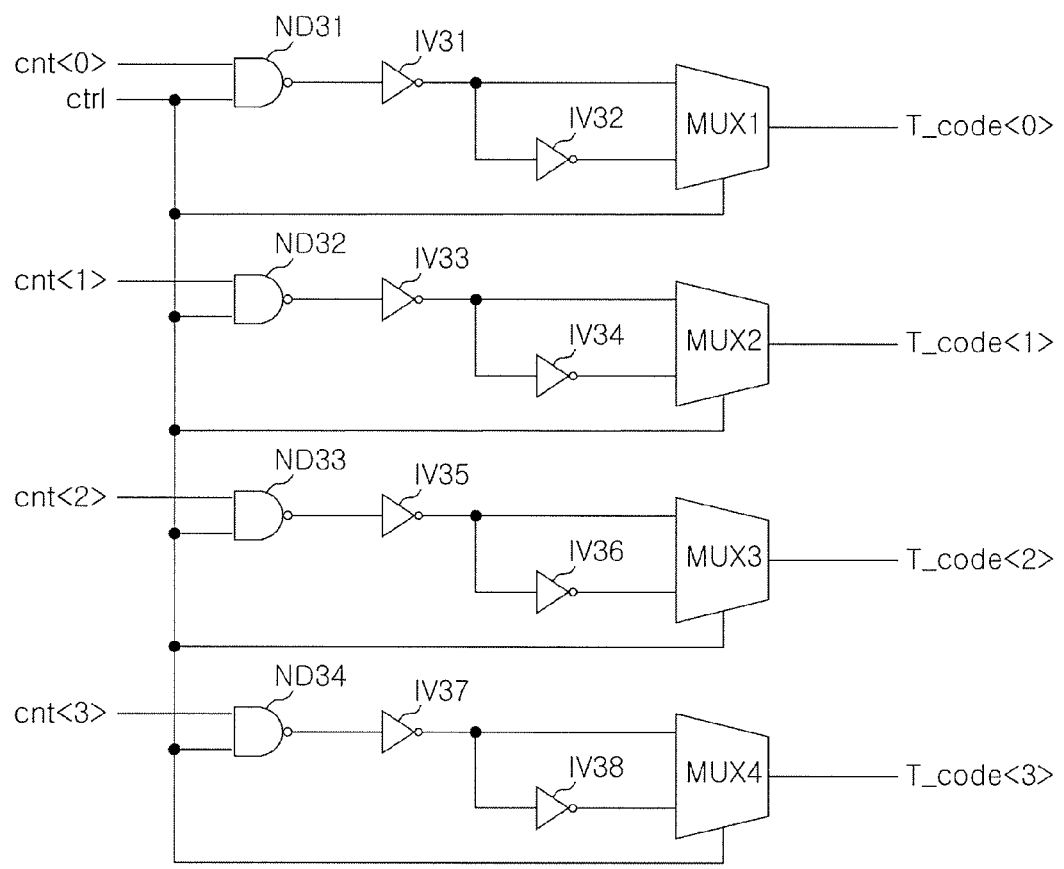
FIG. 5 is a configuration diagram of an exemplary output unit of FIG. 3 according to one embodiment.

As shown in FIG. 5, the output unit 520 can be configured to include fourth to seventh NAND gates ND31, ND32, ND33, and ND34, eighth to fifteenth inverters IV31 to IV38, and first to fourth multiplexers MUX1 to MUX4.

The fourth NAND gate ND31 is configured to receive the first counting signal 'cnt<0>' and the control signal 'ctrl'. The fifth NAND gate ND32 is configured to receive the second counting signal 'cnt<1>' and the control signal 'ctrl'. The sixth NAND gate ND33 is configured to receive the third counting signal 'cnt<2>' and the control signal 'ctrl'. The seventh NAND gate ND34 is configured to receive the fourth counting signal 'cnt<3>' and the control signal 'ctrl'. The eighth inverter IV31 is configured to receive an output signal of the fourth NAND gate ND31. The ninth inverter IV32 is configured to receive an output signal of the eighth inverter IV31. The first multiplexer MUX1 is configured to output the output signal of the eighth inverter IV31 or the ninth inverter IV32 as the first temperature information code signal 'T_code<0>' in response to the control signal 'ctrl'. The tenth inverter IV33 is configured to receive an output signal of the fifth NAND gate ND32. The eleventh inverter IV34 is configured to receive an output signal of the tenth inverter IV33. The second multiplexer MUX2 is configured to output the output signal of the tenth inverter IV33 or the eleventh inverter IV34 as the second temperature information code signal 'T_code<1>' in response to the control signal 'ctrl'. The twelfth inverter IV35 is configured to receive an output signal of the sixth NAND gate ND33. The thirteenth inverter IV36 is configured to receive an output signal of the twelfth inverter IV35. The third multiplexer MUX3 is configured to output the output signal of the twelfth inverter IV35 or the thirteenth inverter IV36 as the third temperature information code signal 'T_code<2>' in response to the control signal 'ctrl'. The fourteenth inverter IV37 is configured to receive an output signal of the seventh NAND gate ND34. The fifteenth inverter IV38 is configured to receive an output signal of the fourteenth inverter IV37. The fourth multiplexer MUX4 is configured to output the output signal of the fourteenth inverter IV37 or the fifteenth inverter IV38 as the fourth temperature information code signal 'T_code<3>' in response to the control signal 'ctrl'. At this time, the first to fourth multiplexers MUX1 to MUX4 can output the output signals of the eighth, tenth, twelfth, and fourteenth inverters IV31, IV33, IV35, and IV37 as the temperature information code signal 'T_code<0:3>' when the control signal 'ctrl' is in the high level. The first to fourth multiplexers MUX1 to MUX4 can output the output signals of the ninth, eleventh, thirteenth, and fifteenth inverters IV32, IV34, IV36, and IV38 as the temperature information code signal 'T_code<0:3>' when the control signal 'ctrl' is in the low level.

An operation of the temperature measurement range compensating circuit of the semiconductor memory apparatus configured as above according to the embodiment will be described below.

When temperature pulse 'T_pulse' is enabled to a high level, an enable pulse generating unit 512 is configured to generate an enable pulse 'en_pulse' enabled as the high level.

When the enable pulse 'en_pulse' is inputted into a pulse combining unit 513, a control signal 'ctrl' is enabled as the high level.

When the control signal 'ctrl' is enabled as the high level, the counter enable signal generating unit 300 is configured to output the temperature pulse 'T_pulse' as a counter enable signal 'cnt_en'. Therefore, when the temperature pulse 'T_pulse' is transitioned to the high level, the counter enable signal 'cnt_en' is also transitioned to the high level. Likewise when the temperature pulse 'T_pulse' is transitioned to a low level, the counter enable signal 'cnt_en' is also transitioned to the low level.

The counter 400 is configured to count a counting signal 'cnt<0:3>' by counting an oscillator signal 'osc' while the temperature pulse 'T_pulse' is enabled as the high level.

Since the control signal 'ctrl' is at the high level, the output controlling unit 500 is configured to output the counting signal 'cnt<0:3>' as the temperature information code signal 'T_code<0:3>'.

If a value of the counting signal 'cnt<0:3>' does not reach the maximum value until the temperature pulse 'T_pulse' is disabled to the low level, then the counter enable signal 'cnt_en' is disabled to the low level when the temperature pulse 'T_pulse' is disabled to the low level. Therefore, the counter 400 stops counting the oscillator signal 'osc' and is reset.

If the counting signal 'cnt<0:3>' reaches the maximum value (1,1,1,1) before the temperature pulse 'T_pulse' is disabled to the low level, the disable pulse generating unit 511 is configured to generate a disable pulse 'dis_pulse' enabled to the low level.

When the disable pulse 'dis_pulse' is generated, the pulse combining unit 513 is configured to disable the control signal 'ctrl' to the low level.

When the control signal 'ctrl' is disabled to the low level, the output controlling unit 500 is configured to fix the temperature is information code signal 'T_code<0:3>' to the maximum value (1,1,1,1). Further, when the control signal 'ctrl' is disabled to the low level, the counter enable signal generating unit 300 is configured to disable the counter enable signal 'cnt_en' to the low level although the temperature pulse 'T_pulse' is not disabled to the low level.

Since the counter enable signal 'cnt_en' is disabled to the low level, the counter 400 stops counting the oscillator signal 'osc' and is reset.

A circuit for compensating a temperature measurement range of a semiconductor memory apparatus can generate accurate temperature information by compensating the temperature measurement range so that an output of a temperature measurement circuit using a counter is not larger than the temperature measurement range.

While certain embodiments have been described above, it will be understood to those skilled in the art that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A circuit for compensating a temperature measurement range of a semiconductor memory apparatus, comprising:
    a counter enable signal generating unit configured to input a temperature pulse having a pulse width proportional to temperature and output the temperature pulse as a counter enable signal in response to a control signal;
    a counter configured to count an oscillator signal when the counter enable signal is enabled, output a counting signal corresponding to a counting result of the oscillator signal and be reset when the counter enable signal is disabled; and
    an output controlling unit configured to generate the control signal in response to the counting signal and the temperature pulse and configured to output a temperature information code signal proportional to the counting signal when the control signal is enabled and to output the temperature information code signal at a fixed level corresponding to a maximum value of the counting signal by inverting an output of the counter which is reset when the control signal is disabled.

2. The circuit of claim 1, wherein the counter enable signal generating unit is configured to output of the counter enable signal which corresponds to the temperature pulse when the control signal is enabled and configured to disable outputting the counter enable signal when the control signal is disabled.

3. The circuit of claim 1, wherein the output controlling unit includes:
a control signal generator configured to disable outputting of the control signal when the received counting signal reaches the maximum value and enable outputting of the control signal when the received counting signal is below the maximum value; and
an output unit configured to output the temperature information code signal proportional to the counting signal when the control signal is enabled and configured to output the temperature information code signal at the fixed level when the control signal is disabled.

4. The circuit of claim 3, wherein the control signal generator includes:
a disable pulse generating unit configured to generate a disable pulse when the temperature information code signal is at the maximum value;
an enable pulse generating unit configured to generate an enable pulse in response to receiving the temperature pulse; and
a pulse combining unit configured to disable the control signal when the disable pulse is inputted and enable the control signal when the enable pulse is inputted.

5. The circuit of claim 4, wherein the disable pulse generating unit includes:
a comparison portion configured to receive the counting signal and to enable a comparison signal as the disable pulse when the received counting signal is equal to a predetermined value; and
a pulse generating portion configured to delay output of the comparison pulse as the disable pulse.

6. The circuit of claim 4, wherein the enable pulse generating unit comprises a second delayer, a fourth and fifth inverters, and a third NAND gate.

7. The circuit of claim 4, wherein the pulse combining unit includes:
an output node voltage controlling portion configured to apply external voltage to an output node when the disable pulse is enabled and configured to apply external voltage to apply the output node to a ground terminal when the enable pulse is enabled; and
a latch portion configured to latch a voltage level of the output node and to output the latched voltage level as a voltage level of the control signal.

8. The circuit of claim 1 further comprising a temperature variable pulse generating unit coupled to the counter enable signal generating unit and to the output controlling unit.

9. The circuit of claim 8 wherein the temperature variable pulse generating unit configured to generate the temperature pulse having a pulse width dependent on temperature variation.

10. The circuit of claim 8 wherein the temperature variable pulse generating unit configured to generate the temperature pulse having a pulse width that increases as temperature increases.

11. The circuit of claim 1 further comprising an oscillator coupled to the counter.

12. The circuit of claim 11 wherein the oscillator is configured to generate an oscillator signal having a predetermined frequency which is substantially independent of temperature variations.

13. The circuit of claim 3, wherein the output unit of the output circuit unit comprises a plurality of NAND gates, a plurality of inverters and a plurality of multiplexers.

14. The circuit of claim 3, wherein the output unit of the output circuit unit comprising a plurality of subunit outputs, in which each subunit output is configured to input the control signal and to input only a single corresponding bit of the counting signal through a corresponding NAND gate, two inverters and a multiplexer so that each subunit outputs only a single bit of the temperature information code signal.

* * * * *